United States Patent
Aleksanyan et al.

(10) Patent No.: US 8,112,730 B2
(45) Date of Patent: Feb. 7, 2012

(54) VARIOUS METHODS AND APPARATUSES FOR MEMORY MODELING USING A STRUCTURAL PRIMITIVE VERIFICATION FOR MEMORY COMPILERS

(75) Inventors: Karen Aleksanyan, Yerevan (AM); Karen Amirkhanyan, Yerevan (AM); Sergey Karapetyan, Yerevan (AM); Alexander Shubat, Los Altos Hills, CA (US); Samvel Shoukourian, Yerevan (AM); Valery Vardanian, Yerevan (AM); Yervant Zorian, Santa Clara, CA (US)

(73) Assignee: Synopsys, Inc., Mountain View, CA (US)

( * ) Notice: Subject to any disclaimer, the term of this patent is extended or adjusted under 35 U.S.C. 154(b) by 562 days.

(21) Appl. No.: 12/249,085

(22) Filed: Oct. 10, 2008

(65) Prior Publication Data

US 2009/0106716 A1   Apr. 23, 2009

Related U.S. Application Data

(60) Provisional application No. 60/980,845, filed on Oct. 18, 2007.

(51) Int. Cl.
  *G06F 9/455* (2006.01)
  *G06F 17/50* (2006.01)
(52) U.S. Cl. ........ 716/111; 716/100; 716/101; 716/102; 716/104; 716/106; 716/107; 716/110; 716/112; 365/201; 714/718; 714/719; 714/722

(58) Field of Classification Search .......... 716/100–102, 716/104, 106–107, 110–112; 365/201; 714/718–719, 722
See application file for complete search history.

(56) References Cited

U.S. PATENT DOCUMENTS

| | | | | |
|---|---|---|---|---|
| 5,854,801 A * | 12/1998 | Yamada et al. | ............... | 714/738 |
| 6,505,323 B1 * | 1/2003 | Lipton et al. | ................... | 716/112 |
| 6,813,201 B2 * | 11/2004 | Zarrineh et al. | ............... | 365/201 |
| 6,941,499 B1 * | 9/2005 | Sung et al. | .................... | 714/741 |
| 7,360,183 B2 * | 4/2008 | Bhadra et al. | ................. | 716/107 |
| 7,424,690 B2 * | 9/2008 | Schultz et al. | ................ | 716/106 |
| 7,464,350 B1 * | 12/2008 | Ho | ............................... | 716/106 |

* cited by examiner

*Primary Examiner* — Nghia Doan
(74) *Attorney, Agent, or Firm* — Fenwick & West LLP

(57) ABSTRACT

A structural primitive verification tool for memory compilers is described. A first set of memory structural primitives are supplied by a designer by filling in fields of a presented user interface. The first set of structural primitives describe certain physical layout features of a proposed memory array in an integrated circuit. A first model of a memory instance derived from the first set of memory structural primitives supplied by the designer is compared to a second model of a memory instance derived from a memory layout file from a memory compiler under-test. The first model is verified against the second model to verify to an integrity of the first set of memory structural primitives supplied by the designer compared to the memory layout file derived from a second set of memory structural primitives configuring that memory instance from the memory compiler.

17 Claims, 10 Drawing Sheets

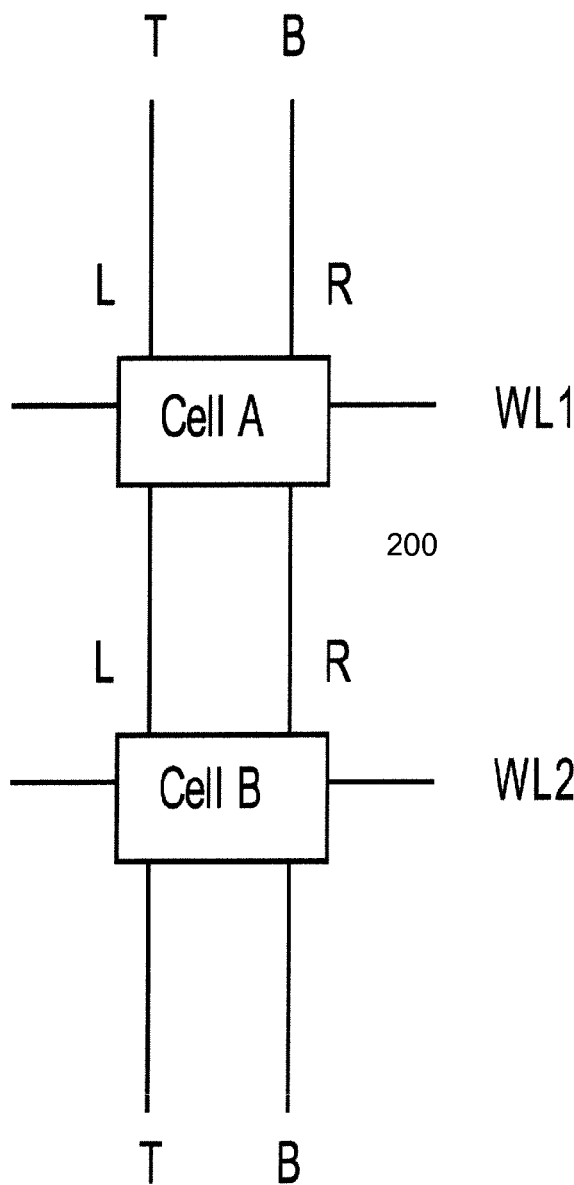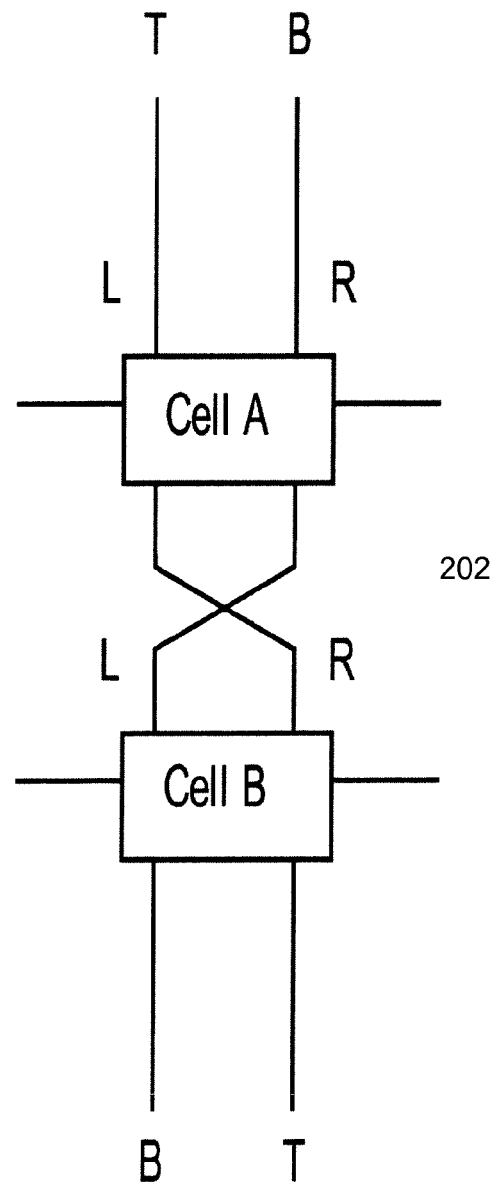
FIG. 2A  FIG. 2B

VARIOUS METHODS AND APPARATUSES FOR MEMORY MODELING USING A STRUCTURAL PRIMITIVE VERIFICATION FOR MEMORY COMPILERS

RELATED APPLICATION

This application claims the benefit of the earlier filing date of the U.S. Provisional Application No. 60/980,845, filed Oct. 18, 2007.

BACKGROUND

An embodiment of the invention generally pertains to large scale integration memory integrated circuits (ICs) that may be used for data storage in a computer, and more particularly to the modeling and computer aided design and testing of such ICs.

Applicants wish to use semiconductor IC manufacturing techniques to drive the development of re-usable IC designs. Computer aided design (CAD) tools such as memory compilers have been developed that allow an IC designer to more efficiently design and verify the operation of a memory component, prior to starting the complex and costly volume manufacturing process for it. A memory component design or intellectual property (IP) component is generated using the compiler that meets a stated performance specification system. This memory IP component may be re-used, to become part of different manufactured IC packages. These include dedicated memory IC packages and a system on a chip (SoC) with embedded memory.

Memory is typically implemented as an array of storage cells, where each cell stores a discrete bit of information (e.g. a binary storage cell can store either a "0" or a "1"). Column and row decoding logic in the memory maps an externally provided address into a selection of one or more of the cells. Once selected, the cells can be either written into or read from, depending on the external command. To test memory, a test engine generates a predefined data pattern which is written to a given address range, and then some time later the given address range is read back. The test engine compares the results of the read with the predefined data pattern, to see if there is any difference that would indicate an error in the memory's operation.

An effective way to test a large scale memory IC is to fill the memory with a particular type of data background (DB). The following are some example DB patterns: solid (all memory cells are filled with "0", or its inverse in which all memory cells are filled with "1"); checkerboard (alternating pattern of "0"s and "1"s in both the row and column directions, or its inverse); and row stripe (rows filled with "0"s alternate with rows filled with "1"s, or its inverse). The proper DB to use depends on the type of fault or defect to be detected.

As explained above, a DB pattern stored in an array of memory cells is generic in that the basic, internal appearance of the pattern would be the same for different types or different sizes of memories. However, the address sequences and data patterns needed on the outside of a memory, to obtain a particular DB pattern, may be different for other types or sizes of memories. That is because the physical or topological internal structure of memory in an IC chip differs from its logical structure that is seen by the user from outside the chip. This effect is referred to as scrambling. For example, logically adjacent addresses may not be physically adjacent (this is called address scrambling), and logically adjacent data bits may not be physically adjacent (this is called data scrambling).

Memory testing also calls for the test engine to determine the physical location of a fault, so that a repair can be affected. For instance, when a faulty cell has been located as being in a particular column, that column can be replaced by a redundant column in the memory (by rerouting address and data signals of the faulty column to the redundant one.) This is also referred to as memory diagnosis and repair. Memory diagnosis may also call for generating a bitmap view of the defective cells in the memory. To do so, the designer of a system IC typically manually extracts information about the physical topology of a memory design from its CAD layout file (that has been produced by a memory compiler), as needed to solve particular test problems. For example, to find the logical address and data sequences needed to write a given DB pattern (the "logical model"), the system IC designer reviews the CAD layout file to determine several physical aspects of the memory design that will impact the logical model. This involves reviewing the layout file to determine data scrambling and bit-line twisting, for example, and then using that information to determine the particular logical address and data sequences needed. The system IC designer then authors a piece of computer code into which these results are incorporated, where this piece of code implements the functionality of generating the DB pattern (the logical model) within the memory's test engine. The test engine so designed becomes a part of the memory (once manufactured) and is able to quickly generate the DB pattern for testing.

SUMMARY OF THE INVENTION

Various apparatus and methods are described for a computing machine-implemented method for creating an integrated circuit, IC, and method to verify proposed memory arrays in that IC. Verification of a first set of memory structural primitives supplied by a designer occurs. The first set of structural primitives that describe certain physical layout features of a proposed memory array in an integrated circuit are received. A first data vector output from a first model of a memory instance derived from the first set of memory structural primitives supplied by the designer is compared to a second data vector output from a second model of a memory instance derived from a memory layout file from a memory compiler under-test. The memory layout file is generated from a memory compiler under-test by invoking scripts from the memory compiler under-test. Verifying the data vector output of the first model to the second model to verify to an integrity of the first set of memory structural primitives supplied by the designer compared to the memory layout file derived from a second set of memory structural primitives configuring that memory instance from the memory compiler. Scripts from the memory compiler under-test are invoked to test each memory instance in a plurality of memory instances to create a verified structural model for all of the memory instances in the memory compiler, where each of the plurality of memory instances has its own generated model.

BRIEF DESCRIPTION OF THE DRAWINGS

While the invention is subject to various modifications and alternative forms, specific embodiments thereof have been shown by way of example in the drawings and will herein be described in detail. The invention should be understood to not be limited to the particular forms disclosed, but on the contrary, the intention is to cover all modifications, equivalents, and alternatives falling within the spirit and scope of the design.

FIG. 2a illustrates a block diagram of an embodiment of a pair of adjacent memory cells of the same column whose associated bitline shows no twist.

FIG. 2b shows a block diagram of an embodiment of two adjacent cells in the same column, where the bitlines connecting the two cells to each other have a twist.

DETAILED DESCRIPTION

In the following description, numerous specific details are set forth, such as examples of specific data signals, named components, connections, types of power gating designs, etc., in order to provide a thorough understanding of the present design. It will be apparent, however, to one skilled in the art that the present design may be practiced without these specific details. In other instances, well known components or methods have not been described in detail but rather in a block diagram in order to avoid unnecessarily obscuring the present design. Thus, the specific details set forth are merely exemplary. The specific details may be varied from and still be contemplated to be within the spirit and scope of the present design.

The structural primitive verification tool for memory compilers is configured to provide verification of a first set of memory structural primitives. The first set of memory structural primitives may be supplied by a designer by filling in fields of a presented user interface or some other similar mechanism. The verification of the memory structural primitives supplied by the designer occurs by comparison to the actual information in a memory layout file (such as Graphic Design System) from the memory compiler with that memory's structural primitives. The one or more structural primitives describe certain physical layout features of the proposed memory array in the Integrated Circuit. Thus, the formal description of the structural primitives supplied by the designer by filling in fields of a presented user interface is verified against the actual memory layout (GDS) via a model comparison of the two.

Also, the verification is performed not for a single memory instance but for the memory compiler that may generate thousands of memory instances. The structural primitive verification tool for memory compilers stores instructions to invoke scripts from the memory compiler under-test to test a plurality of memory instances to create a verified structural model for the memory compiler so that a user does not later need to verify a memory model for each instance generated by that memory compiler.

Figure 1A:
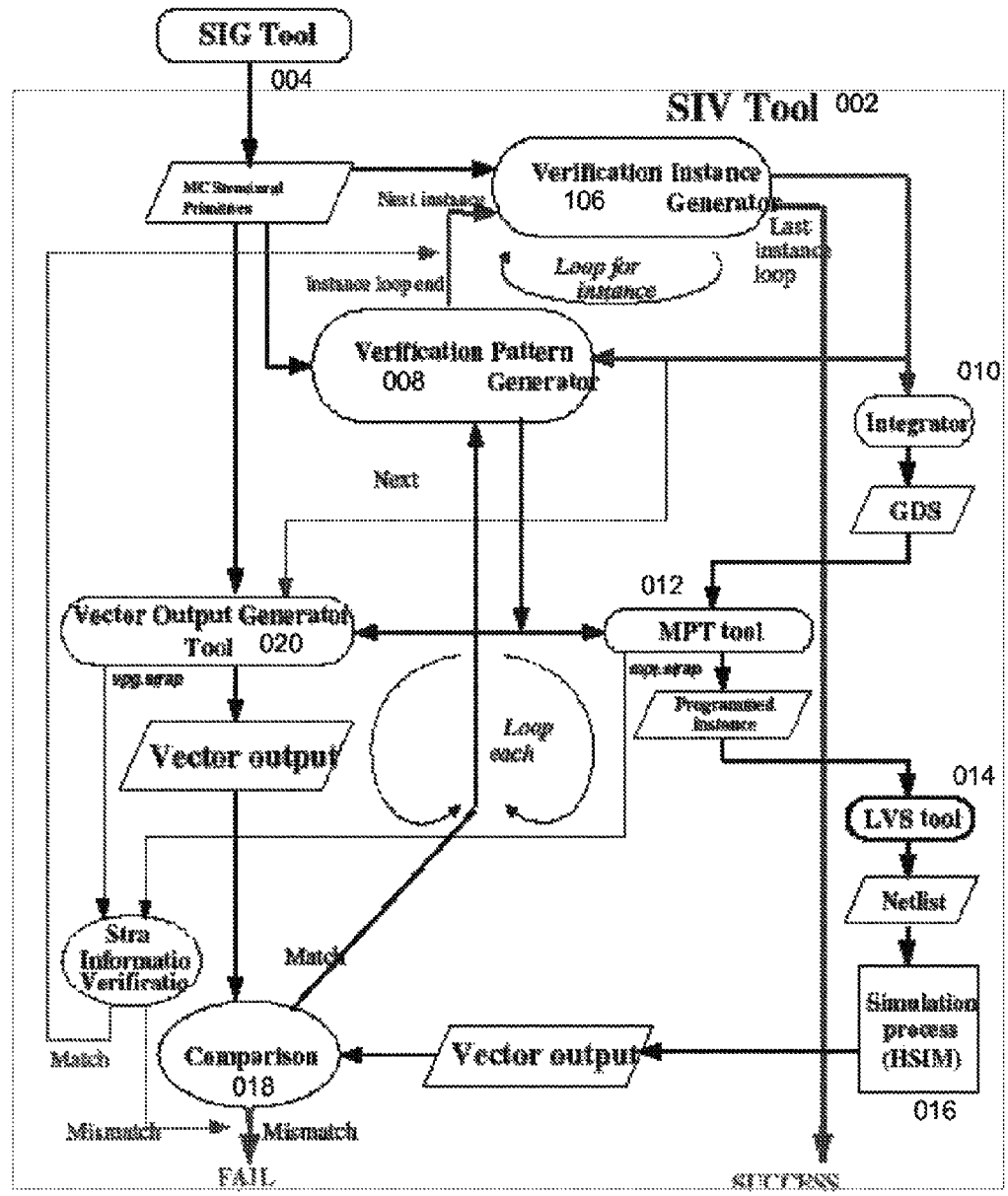
FIG. 1A is a flow diagram of an embodiment of a method to perform memory compiler structural primitives' verification.

FIG. 1A illustrates a diagram of the structural primitive information verification flow along with the structural primitive verification tool for memory compilers structural diagram. The structural primitive verification tool for memory compilers 002 consists of several functional blocks that perform the scramble information verification through the comparison of memory compiler scrambling information and unscrambled memory data derived from the memory GDS file. The following functional blocks/tools are launched within the structural primitive verification tool for memory compilers 002: a verification instance generator 006; a verification pattern generator 008; a vector output generator 120; a memory programming tool 012; an integrator tool 010; a comparison module 018, and other similar tools.

The structural primitive verification tool for memory compilers 002 consists of multiple functional blocks, which are configured via software code, hard coded logic, or some combination of both. The components on the left side of the structural primitive verification tool for memory compilers 002 consists primarily of functional blocks to obtain memory structural primitives supplied by the designer and generate the data vector output from a first model of the memory instance. The components on the right side of the structural primitive verification tool for memory compilers 002 consists primarily of functional blocks to run a second model simulation of the memory instance from memory layout file produced by running the scripts for that layout from the memory compiler itself.

On right hand side of the structural primitive verification tool for memory compilers 002 the following processes occur.

In step 1, the structural information generation/gathering (SIG) tool 004 generates a user interface with fillable fields that solicit memory structural primitives from a designer by filling in the fields of the presented user interface. The SIG tool 004 gathers the structural primitives and generates a file, such as a scramble.tcl file, containing the memory compiler scrambling information and structural primitive information based the solicited information extracted from the designer on the description of memory structure. The SIG tool 004 sends the scramble.tcl file to the verification pattern generator 008, the verification instance generator 006, and the vector output generator 120. These components receive the first set of structural primitives including a number of words that can be stored, a number of bits in a word; a column multiplexer ratio and one or more other structural primitives that describe certain physical layout features of a proposed memory array in an integrated circuit.

In step 2, the verification instance generator 006 is configured to produce a set of required verification memory instance configurations based on the received memory structural primitives, which include a scramble-related description of a structure the memory instance. The verification instance generator 006 generates a minimal number/configuration of instances based on different structural primitive scrambling criteria including address scramble, bank scramble, row scramble, I/O cell scramble, column scramble, bit-line and column twisting, row redundancy, and column redundancy. When the verification instance generator 006 receives structural primitive parameters with a range value for the memory instances associated with the memory compiler under test, then the verification instance generator 006 merely generates a first memory instance with structural parameters at a minimum value of the range and a second memory instance with structural parameters at a maximum value of the range.

In step 3, a verification pattern generator 008 is configured to produce a set of required data verification patterns for each memory instance under-test. Thus, the first set of memory structural primitives that include scrambling types that are verified using the data verification patterns from the verification pattern generator 008 include one or more of Memory bit-line twisting; Bank scrambling; Column scrambling (see FIG. 2b and FIG. 6 for examples); Row scrambling (see FIG. 7 for an example); input output (I/O) cell scrambling (see FIG. 5 for an example); and Address scrambling.

In step 4, a special integrator tool 010 is configured to generate a memory instance layout file for a given memory configuration supplied from the verification instance generator 006. The special integrator tool 010 couples to an output of the verification instance generator 006 to receive the information regarding the memory instance configuration. The special integrator tool 010 invokes scripts in a memory compiler under-test to generate a memory instance layout in a GDS file format for a given memory verification instance. Thus, the special integrator tool 010 invokes the scripts of the actual memory compiler for each memory instance needing verification. This operation is performed per each verification instance configuration to generate the memory instance layout in GDS format or some other similar format.

In step 5, the memory program tool (MPT) 012 is configured to generate memory instances, based on the memory instance GDS file from the memory compiler under-test, that are programmed with a data verification pattern from the verification pattern generator 008. The special integrator tool 010 either 1) couples to an input or 2) makes a function call to the memory program tool 012 to receive the memory instance GDS file. The memory program tool 012 programs the data verification pattern supplied from the verification pattern generator 008 into the memory instance layout file for each verification pattern.

Figure 8:
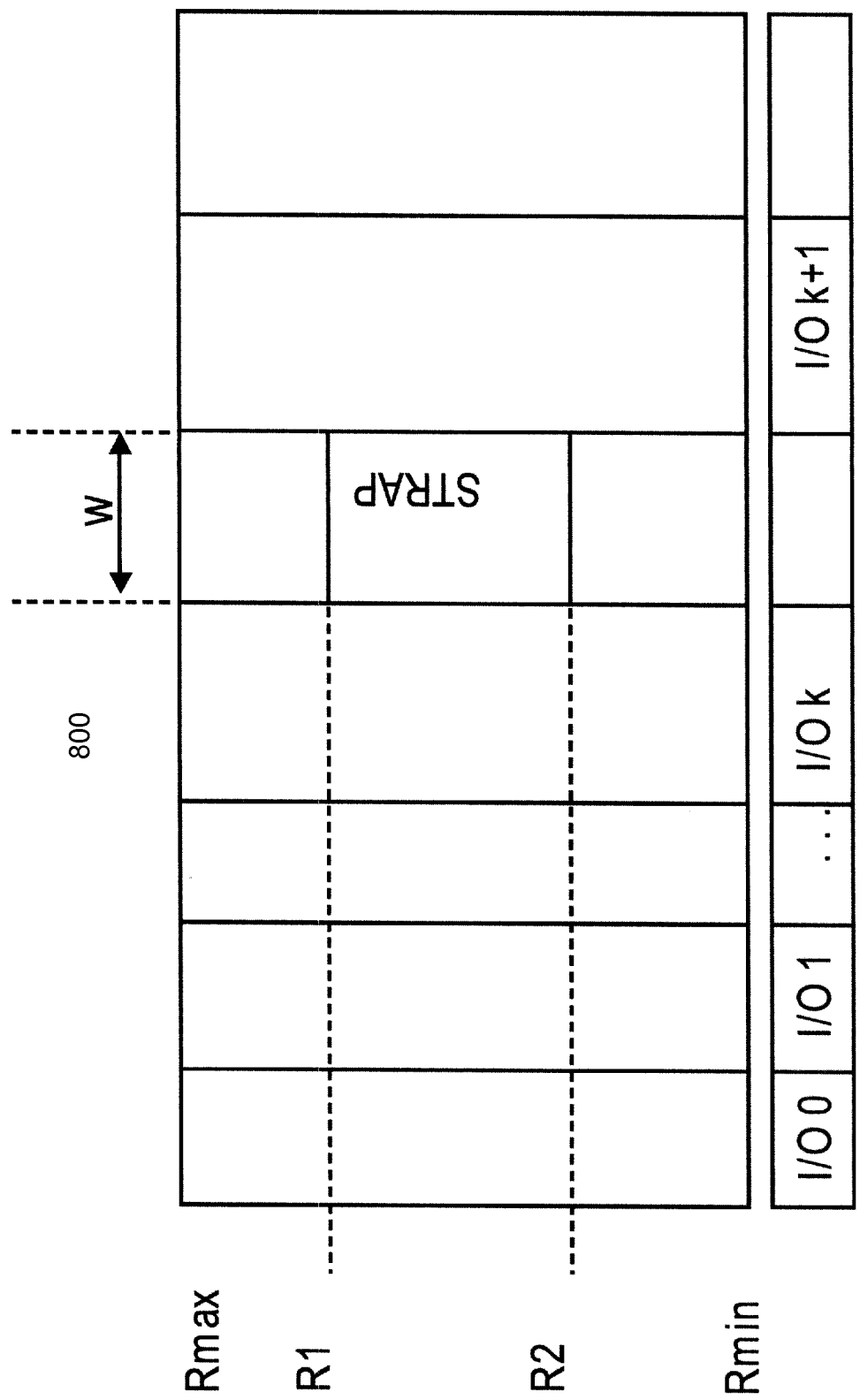
FIG. 8 shows an example of a rectangular physical strap in a memory array.

Another function of the memory program tool 012 is verification of strap information (see FIG. 8 for an example). Thus, the verification flow implements at least two kinds of structural primitives: those that define the mapping between logical addressing and physical position (e.g. the different scrambling primitives described above) and those that give only physical information (e.g. strap distribution, power distribution, dummy element).

The memory program tool 012 generates the memory instance with the programmed-in data verification pattern along with a mpt.strap strap distribution information file derived from memory GDS. The latest is used for the strap information verification through the comparison with the strap distribution information (vpg.strap) extracted from the scramble information file. Any difference between these information files will indicate an error in the strap distribution information in scrambling information file. The verification is successful if strap information is matched for all verification instances.

In step 6, a net-list is extracted from the memory instance with the programmed in data verification pattern. The structural primitive verification tool invokes a Layout vs. Schematic (LVS) tool 014 (such as Calibre) to use the memory instance with the programmed-in data verification pattern from the memory program tool 012 to extract a memory net-list from an instance of a layout file of the memory with the data verification pattern programmed-in. The memory net-list is simulated in the next step.

In step 7, a simulation tool 016 uses the memory net-list from the LVS tool 014, and runs a read cycle simulation for all addresses of the model of the memory instance derived from the memory layout file. The simulation tool 016 runs the model simulation to generate the data vector output representative of the data pattern programmed in from the memory program tool 012. The simulation tool 016 (such as HSIM) generates the simulated data vector output and during the simulation the physical layout to logical layout translation occurs. The data vector output from the model of a memory instance derived from the memory layout file is sent to the comparison module 018.

On left hand side of the structural primitive verification tool for memory compilers 002 the following processes occur.

In step 1, the SIG tool 004 generates a user interface with fillable fields that solicit memory structural primitives from the designer by filling in fields of the presented user interface.

In step 2, the verification pattern generator 008 produces the set of required verification patterns per each memory instance including the memory compiler scrambling information. (See FIGS. 3 and 4 for examples)

In step 8, using the information on memory intermediate model description, the vector output generator 120 predicts the data vector output per each verification pattern. The vector output generator 120 is configured to use the first set of memory structural primitives solicited by the user interface from the designer to predict a data vector output for each verification pattern. The vector output generator 120 performs a physical layout to logical layout translation for a memory instance under-test. The vector output generator 120 then inputs a verification pattern from a verification pattern generator 008 into the model of the memory instance. In an embodiment, the vector output generator 120 produces the data vector output per each verification pattern using the information on a scrambled memory (i.e. scramble.tcl file). This output is the vector format representation of an already scrambled verification instance stuffed with the current particular verification pattern supplied from the verification pattern generator 008.

The vector output generator 120 maps test data patterns for verification from a logical address in the layout of a memory instance from the memory compiler under-test to the physical layout of the memory instance under-test. The vector output generator 120 maps test data patterns for verification received from the verification pattern generator 008 and then generates the model of a memory instance derived from the first set of memory structural primitives supplied by the designer.

Additionally, the vector output generator 120 produces a vpg.strap file containing strap distribution information also extracted from the scrambled memory information file.

For example, to find the logical address and data sequences needed to write a given DB pattern (the "logical model"), the vector output generator 120 reviews the scramble TCL file to determine several physical aspects of the memory design that will impact the logical model. This involves reviewing the scramble TCL file to determine data scrambling and bit-line twisting, for example, and then using that information to determine the particular logical address and data sequences needed. The model from the vector output generator 120 generates a data vector output that is sent to the comparison module 018.

In an embodiment, a difference exists with the data vector output generated with the model from vector output generator 120, i.e. no scrambling information is used while the data vector output generated with the model from the simulation tool 016 represents an unscrambled verification instance.

In step 9, a comparison module 018 compares the first model of a memory instance derived from the first set of memory structural primitives supplied by the designer to the second model of a memory instance derived from a memory layout file from the memory compiler under-test in order to verify the integrity of the memory instances in the memory compiler first model to the second model. Accordingly, the comparison module 018 verifies a first data vector output from the first model to a second data vector output from the second model to verify to an integrity of the first set of memory structural primitives supplied by the designer compared to the memory layout file derived from the second set of memory structural primitives configuring that memory instance from the memory compiler. Thus, the two data vector outputs of logical data representative of the programmed-in data patterns from the verification pattern generator 008 are compared, and any difference will indicate an error in the structural primitive information. For example, the difference indicated by a mismatch in the pattern would indicate that the scramble information is incorrect.

An additional description of some of the functional components making up the verification tool presented below.

The verification instance generator 006 is configured to generate for verification purposes the minimum set of memory instances that covers all possible cases defined in memory scramble information. The term "minimum set" refers both to the number of instances and memory configuration. The verification instance generator 006 uses as an input the scramble.tcl generated by SIG tool 004 and takes the required information on memory compiler parameters. The verification instance generator 006 when collecting structural primitive parameters with a range values, (i.e. 0-128 Kilobytes, ratios of two column multiplexers per I/O to six column muxes per I/O, etc), from the SIG tool 004, the verification instance generator 006 merely generates a first memory instance with structural parameters at the minimum value of the range and a second memory instance with structural parameters at the maximum value of the range.

Additional details on the minimum number & configuration of memory instances for Scramble Information Verification are discussed later.

The verification pattern generator 008 provides the pattern set per each generated memory instance. The verification pattern generator 008 generates two configuration sets:
a. <name>_asv.cfg to verify the address scrambling (i.e. physical-to-logical mapping);
b. <name>_sdv.cfg to verify the strap distribution.

The verification pattern generator 008 produces the minimal number of verification patterns sufficient for automated verification of scrambling types. The verification pattern generator 008 uses as an input the scramble.tcl generated by the SIG tool 004 and takes the required information on memory compiler parameters. The total number of verification patterns used for verification of all scrambling types depends on the memory compiler and the certain configuration of compiler main parameters.

In addition to the traditional checkerboard pattern, other topological (physical) data patterns include solid, row stripe, column stripe, double row stripe, double column stripe, as well as others. Generating a physical DB pattern for a proposed memory IC design uses a number of different types of scrambling information. This scrambling information identifies the differences between the topological or physical features of a memory structure, and the logical or user interface level.

Additional details on the description of minimal patterns for scramble information verification are discussed later.

A data vector output may be the data loaded into and paired with addresses in the memory instance, which ultimately produce the required pattern. The data vector output generally corresponds to a physical data pattern of logical ones, logical zeros and any combination of the ones and zeros according to a logical-to-physical address mapping of the memory instance under test. (See FIGS. 3 and 4) The data vector output may be saved in a HSIM compatible format.

The vector output generator 120 generates the data vector output for a current verification instance based on the scrambling data and the required pattern. In an embodiment, the vector output generator 120 takes as an input the scramble.tcl generated by SIG tool 004. The vector output generator 120 then uses a current verification instance to generate the data vector output for each pattern generated by the verification pattern generator 008.

Figure 3:
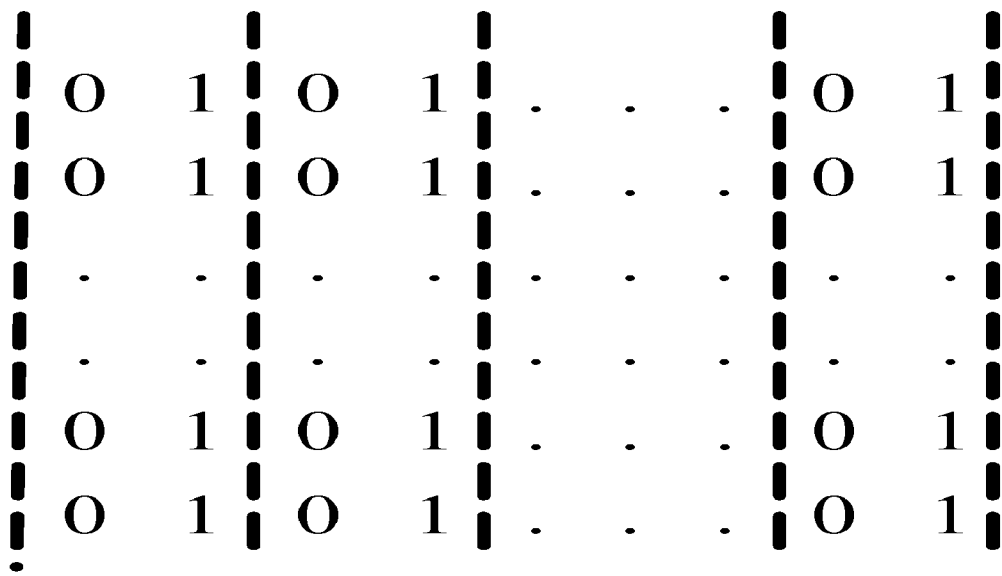
FIG. 3 illustrates a block diagram of a data verification pattern of topological column stripe with respect to bit-lines in the memory array.

FIG. 3 illustrates a block diagram of a data verification pattern 300 of topological column stripe with respect to bit-lines in the memory array.

Figure 4:
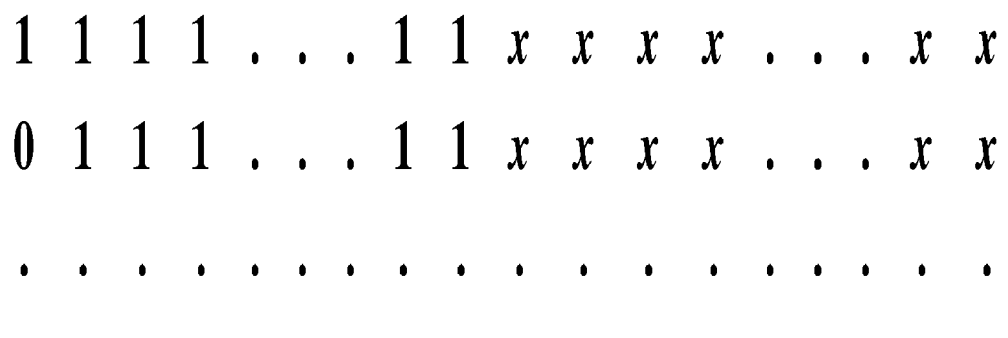
FIG. 4 illustrates a block diagram of a data verification pattern for a bank in the memory array.

FIG. 4 illustrates a block diagram of a data verification pattern 400 for a bank in the memory array.

The memory programming tool 012 generates the programmed memory instance based on the memory instance GDS file. The description of the memory instance with the programmed in data verification pattern can be generated by overlaying memory bit cells with constant values based on the data verification pattern. Any verification pattern is represented by a set of "0", "1" and/or "X" values. In case of "0" and "1", the memory programming tool 012 overlays memory instance bit with constant 0 and constant 1 bit cells, while no changes are made in case of "X" value. See for example FIGS. 3 and 4. Thus, these programmed cells ensure that the required physical pattern is generated in the memory array. Cell overlaying is performed based on the physical location of bit cells and other information available in the instance GDS file. The memory programming tool 012 also generates the mpt.strap file to be used for the strap information verification. This file represents the memory strap locations assuming straps can be located both vertically and horizontally, starting either from 0 or non-zero row/column. The following format is used for strap description in mpt.strap file:
<direction: H/V (horizontal or vertical)><row/column start number><strap size>
The example below represents a fragment of mpt.strap file:

| | |
|---|---|
| H row #0 | 35.995 |
| H row #32 | 0.89 |
| H row #64 | 0.89 |
| H row #160 | 0.89 |
| H row #192 | 0.89 |
| H row #258 | 1.51 |
| V col #0 | 0.82 |
| V col #8 | 72.33 |
| V col #18 | 0.82 |

Overall, an aspect of the method above performs memory compiler structural primitives' verification. The method may incorporate memory scrambling information into the verification. The method can incorporate compiler level rather than a single memory instance level scramble information extraction. The method can obtain trustworthy scramble information extracted from the memory layout as well extraction of scramble information using net-list extraction and simulation that applied a sufficient number of patterns to get complete information.

The memory structural model is used to generate a memory's advanced test & repair infrastructure. A correct memory structural model is required to provide high fault coverage for embedded memories. The method of structural model verification for a memory compiler allows many features such as providing correct memory structural model, providing the Built In Self Test with relatively high fault coverage, checking the memory structure information, and proving the effectiveness of the automated verification flow for the memory structural model used with one or more memory compilers.

Thus, the structural primitive verification tool for memory compilers 002 relates generally to the field of memory modeling for enhancement of efficiency of their test, diagnosis and repair infrastructure. More specifically, the structural primitive verification tool for memory compilers 002 relates to verification of memory structural primitives via comparison of information in memory layout (GDS) with that in memory's structural primitives. The formal description of the structural primitives is verified by layout (GDS) vs. model comparison. The comparison flow assumes memory configuration set selection, memory layout generation for these configurations, pattern programming, spice net-list extraction, netlist simulation, vector output prediction and result comparison.

An interesting part of the structural primitive verification tool for memory compilers 002 is having a verified memory structural model. The verification of structural primitives provides integrity to memory modeling system and allows development of multiple effective applications such as STAR Debugger, Bitmap Viewer, BP Generator, Bit Browser, etc.) based on the memory intermediate model. The memory modeling system (including the SIG and structural primitives verification tools) allows supporting third party memories (background pattern generation) without requiring the actual code of used to create the third party memories.

In general, some other aspects include the following.

Figure 1B:
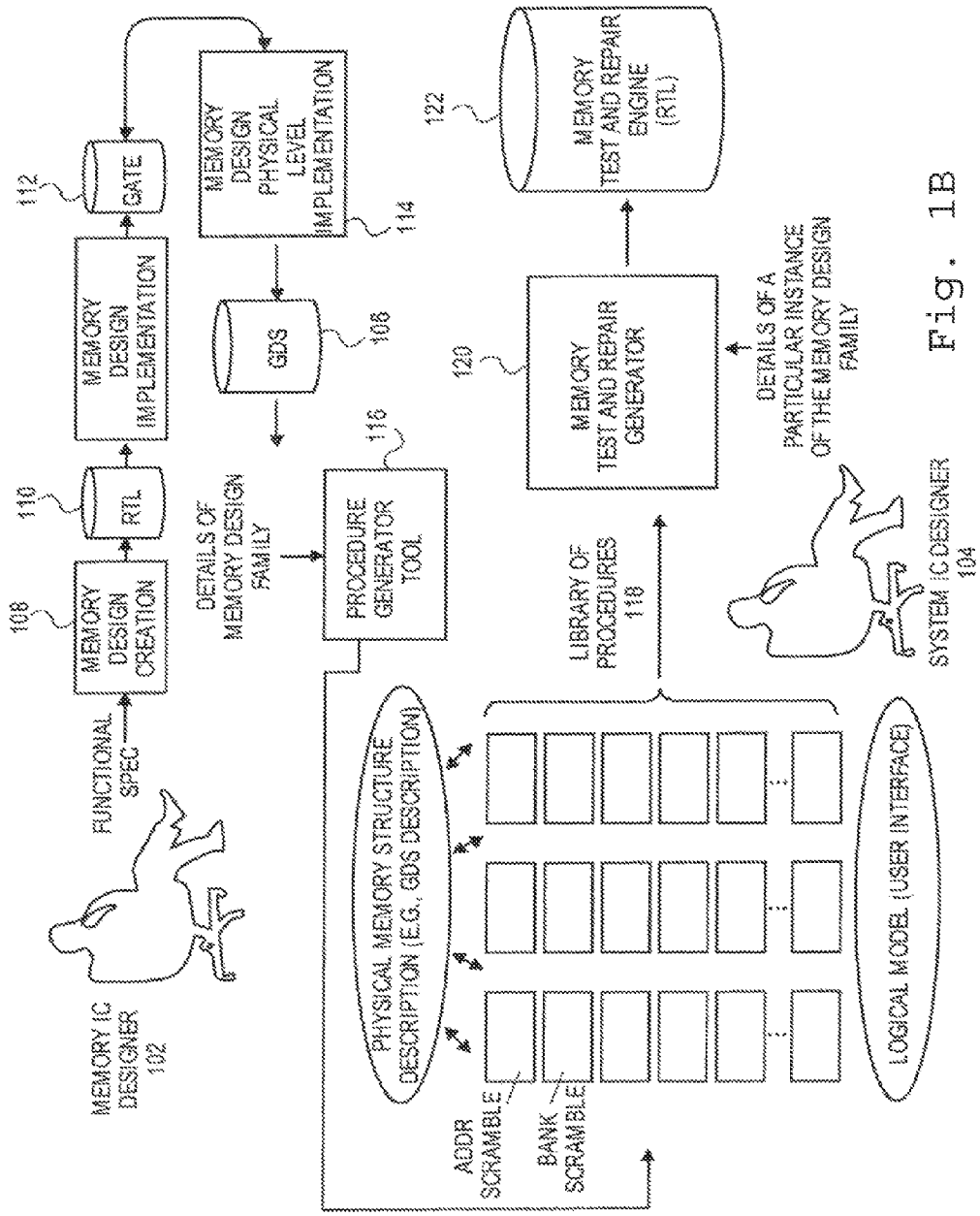
FIG. 1B is a block diagram of an embodiment of the overall process for creating a design tool and its subsequent use by a system IC designer to create a test engine for an IC memory design.

FIG. 1B is a block diagram of the overall process for creating an IC design tool and its subsequent use by a system IC designer to create a test engine for an embedded memory IC design, in accordance with an embodiment.

During the design of an integrated circuit, a design phase exists for creating the components such as memory and processor blocks that will become part of that Integrated circuit. A significant period in time may occur between when a memory IC designer creates the parameters for the components the designer wants in that memory instance and creates a memory layout file of the integrated circuit and when the System IC designer engages in creating the testing and repair phase of the blocks making up the IC. The System IC designer may want to check to verify that the memory instance with the structural parameters the designer believes they have created in the formal description matches the memory instance with the structural parameters being generated by the memory compiler. Therefore, creating a tool that verifies memory instances using the structural model with a final verification of the accuracy of that model is useful. The structural primitive verification tool for memory compilers can verify this accuracy.

The process begins with the creation of a memory design based on the functional specification, using known CAD software running on a computer (operation 108). This results in a design or description of the IC, such as in a register transfer level (RTL) format. The RTL file 110 is an example of a hardware description language that describes a circuit's behavior in terms of the flow of signals or transferred data between hardware registers, as well as the logical operations that are performed on those signals.

Next, the CAD software (with the help of the memory IC designer 102) implements the memory design by converting the RTL description into a gate level description (gate level file 112). This is often done using a logic synthesis software tool. The results of the synthesis are then used by placement and routing tools to create the physical layout (here, GDS file 106), during what is referred to as the physical level implementation (operation 114). The overall process for producing the physical level description or physical layout of the IC memory may be repeated using memory compiler software, to produce a family of several different memory designs by the memory IC designer 102 (or the entity with whom he is associated).

The tool 116 may be part of a memory compiler that has been created for a family of memory designs. Such a compiler may generate different instances of a memory array, which are encompassed by a given family of memory arrays. Each instance of a memory array may have a different number of words, a different word size, and/or a different layout (e.g. the same column decode architecture but different row decoding). All members of a family may have the same bit cell size, the same amount of total storage, the same approximate range of read or write latency performance, and are to be manufactured using the same integrated circuit manufacturing process technology (e.g. complementary metal oxide semiconductor, or CMOS). An example of a family of memory designs is the STAR memory family by Virage Logic, Inc of Fremont, Calif.

The verified structural primitives of the memory instance may be used in programming the logic that supports the embedded self test and repair processor for the memory system on the chip. The memory structural model is used to generate a memory's advanced test & repair infrastructure. A correct memory structural model is required to provide high fault coverage for embedded memories. The method of structural model verification for a memory compiler allows many features such as providing correct memory structural model, providing the Built In Self Test with relatively high fault coverage, checking the memory structure information, and proving the effectiveness of the automated verification flow for the memory structural model used with one or more memory compilers.

The procedure generator tool 116, which produces the library of procedures 118, may be authored in any suitable computer programming language. Each of the procedures 118 produced by the tool 116, in this example, is a tool command language, Tcl, procedure. Tcl is a scripting language that is commonly used for testing. Other suitable programming languages can, alternatively, be used to define the library of procedures 118.

This diagram contemplates work by two different IC designers, namely a memory IC designer 102 and a system IC designer 104. As an alternative, however, the entire process may be performed by the same IC designer who may be working for a single entity that is responsible for developing both the memory design and the design of the system in which the memory will be incorporated.

The memory IC designer 102 is responsible for defining or taking a functional specification for IC memory, and translating these high level functional requirements into a physical level implementation, ultimately in the form of a computer-aided design (CAD) layout file. In FIG. 1A, this physical layout file is represented using a graphic data system (GDS) file 106. The GDS format is a currently popular format for aiding interchange of IC mask information. It may generally be viewed as a completed IC design that is ready for delivery to, for instance, a mask vendor.

The computer-readable procedures, when executed by a computer, produce a set of structural primitives that describe certain physical layout features of a proposed IC memory array. As depicted in FIG. 1B, the library of procedures 118 as a whole translate between a physical model of the family of IC memories, and a user interface or logical model of the family. The procedures describe the scrambling information that is relevant to applications which test an IC memory.

Address Scrambling

In general, variables representing the row, column and banks of a memory array may be matched to different address (logical) variables. Depending on the mapping, different row, column and bank scrambling information can be obtained. A possible format for address scrambling here is that the address variables ADDR0, ADDR1, ADDR2 . . . are mapped to the row, column and bank variables, for each possible combination of BK and CM values that define an instance of the memory array.

Bank Scrambling

A memory array may have a two-dimensional bank structure in general. The physical position of the banks may not correspond to the logical address. The creation of topological DB patterns may need to identify the mapping between the logical and physical bank addresses. The bank scrambling procedure would take a logical bank address as input, and would return the physical number of the corresponding bank counting from a particular preset location in the array. Similarly, another bank scramble procedure may be defined that takes a physical bank number as input, and returns the logical address of the bank.

Row Scrambling

A row scramble procedure may be defined that takes the row logical address as input from the address pins of the memory, and returns the physical row number of the corresponding row (where the reverse may also be defined as taking the physical row number as input and returning the logical row address). Note that in the event the proposed memory IC is expected to have word line twisting in the memory array, different blocks of the memory array may have different row scrambling. This results in different DB patterns being generated for different blocks of the memory array.

Column Scrambling

A column scramble procedure may be defined that takes the physical I/O number (which identifies a particular I/O device of the memory) and the logical column address as input, and returns the physical column position for the specified I/O. Similarly, a reverse procedure may also be defined that takes the physical I/O number and the physical column position as inputs, and returns the logical column address. Note that in the event the memory array has column twisting, then different blocks of the memory array may have different column scrambling. This results in different DB patterns for different blocks of the memory array.

Memory Bitline Twisting and Mirroring

FIG. 2a illustrates a block diagram of an embodiment of a pair of adjacent memory cells of the same column whose associated bitline shows no twist 200.

FIG. 2b shows a block diagram of an embodiment of two adjacent cells in the same column, where the bitlines connecting the two cells to each other have a twist 202.

FIG. 2a and FIG. 2b depict an example physical structure in a memory array that creates bitline twist scrambling. Note that "T" represents a signal's "true" value while "B" represents its complement ("bar"). In this example, "L" represents "left", i.e. closer to the lower numbered, adjacent column, while "R" represents "right" (closer to the higher numbered, adjacent column). The memory bitline twist scramble procedure may be defined as returning a list of a pair of physical row numbers, a physical I/O number and a physical column number. This procedure identifies a twist row as being between certain rows and bitlines of a particular physical column. All of the bitline pairs that are twisted may be listed in a predefined order, e.g., from bottom to top and from left to right. As an example, the bitline twisting information may list the twist location as a pair of row and column addresses.

I/O Bitline Twisting

The bitlines that feed the input/output (I/O) cells (which includes sense amplifiers) may also twist just before connecting to an I/O cell, relative to neighboring I/O bitlines.

I/O Bitline Mirroring

The bitlines that connect to the I/O cells may also be mirrored relative to neighboring I/O bitlines.

I/O Cell Scrambling

Figure 5:
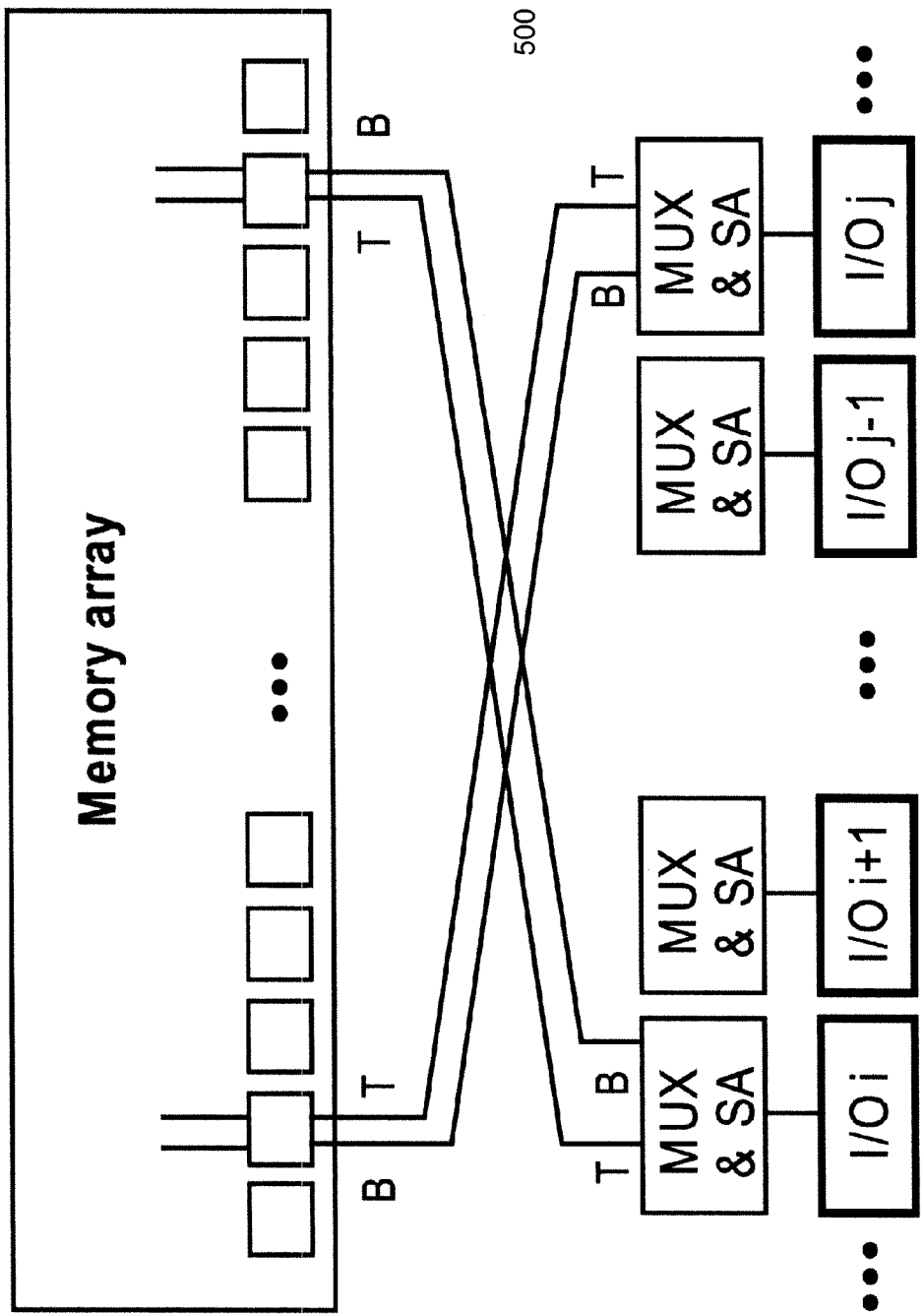
FIG. 5 shows a block diagram of an embodiment of part of a memory array that has a simple I/O column twist.

FIG. 5 shows a block diagram of an embodiment of part of a memory array that has a simple I/O column twist 500. FIG. 5 illustrates an example of I/O column scrambling. The I/O cells of a memory may have different ordering, in the logical and physical levels. The mapping between the logical and physical I/O cell numbers is needed for generating a DB pattern. The direction of the order of the I/O cells, e.g., left-to-right or right-to-left, may be identified and set, for the I/O scramble procedures described here. For each memory compiler configuration, e.g. each combination of NW and CM, the corresponding physical I/O number is entered into a table, per each logical I/O number. This allows the I/O scramble logical-to-physical procedure to take an I/O logical address as input, and return the physical I/O number of the corresponding I/O device. Similarly, the reverse function may also be defined as taking the physical I/O number as input, and returning the I/O logical address.

I/O Column Twist

For any pair of columns of cells that are connected to I/O cells (which may include sense amplifiers and multiplexers), the columns may be deemed twisted. This is the type of information that is also useful for generating a physical DB pattern. A simple column twist is depicted in FIG. 5 as the switching of two column locations when a pair of one column bitline twists with the corresponding pair of second column bitlines.

Column Twist

Figure 6:
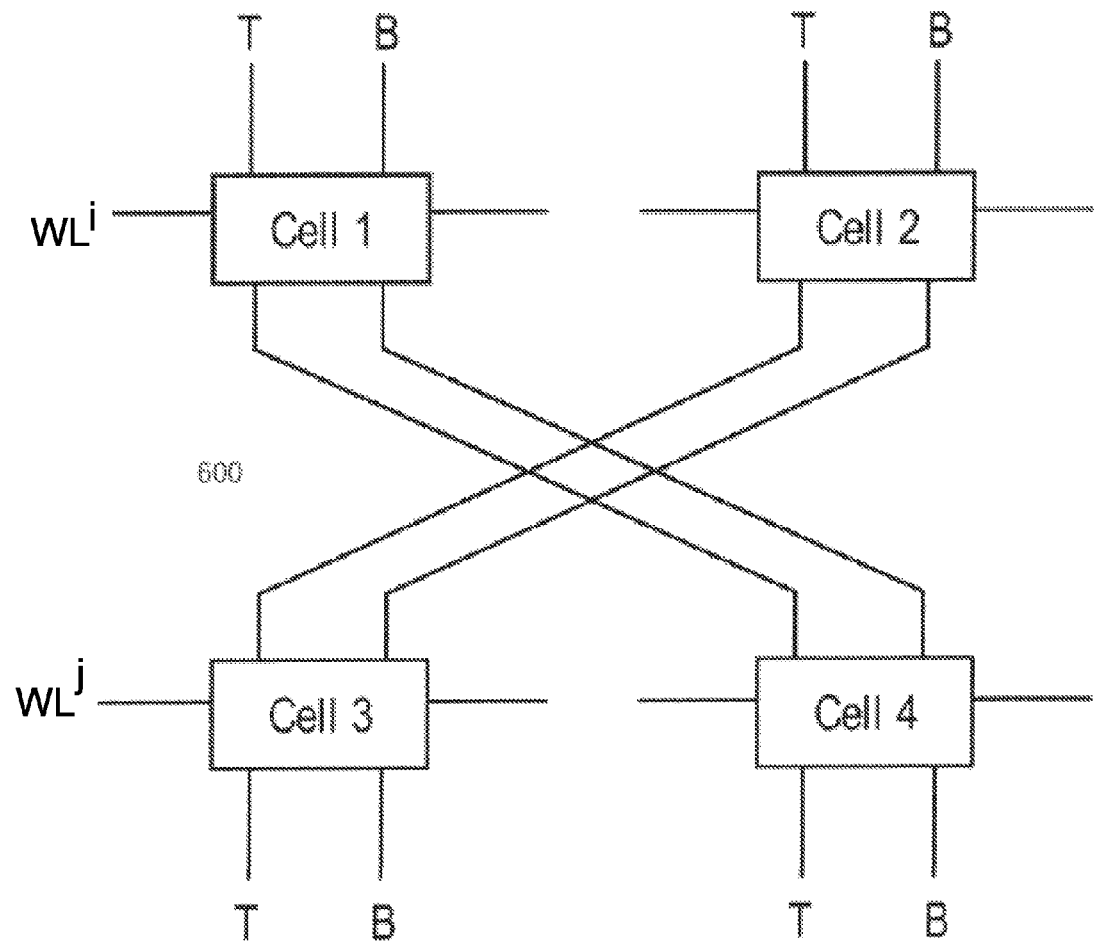
FIG. 6 shows a block diagram of an embodiment of a simple column twist between two rows of cells.

FIG. 6 shows a block diagram of an embodiment of a simple column twist between two rows of cells 600. There may be at least two types of column twist: simple and complicated. A simple is depicted in FIG. 6 as the switching of two column locations when a pair of bitlines from one column twists with the corresponding pair of bitlines from another column.

Wordline Twist

Figure 7:
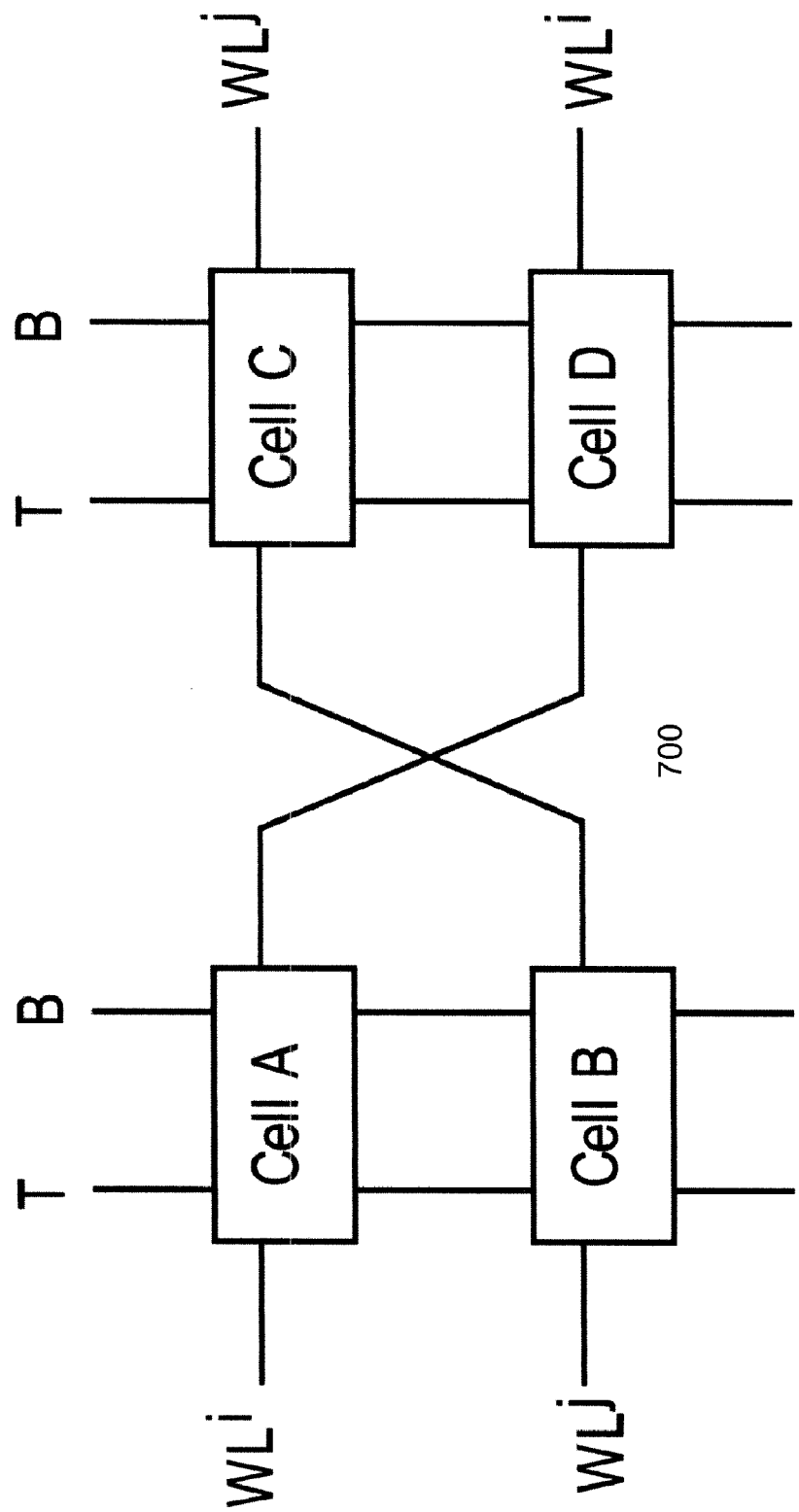
FIG. 7 shows a block diagram of an embodiment of a word line twist in a single port memory.

FIG. 7 shows a block diagram of an embodiment of a word line twist 700 in a single port memory. A wordline twist for single port memory cells may be defined as the switching of two row locations where a row wordline twists with the wordline of a second row. This is depicted in FIG. 7.

Port Scrambling

For dual port memories, the physical and logical labeling of ports needs to be described. In practice, the memory logical port labeling, as well as bitline labeling, may not match the physical labeling.

Metal Layer Scrambling

In some memory types, such as HD Dual Port ASAP 512K memory, the port bitlines are located on different metal layers. A logical numbering of metal layers Mi1, Mi2, . . . may not match the physical numbering M1, M2, . . . (e.g., due to a change in the metal layer of a port bitline at the center of the array.) Accordingly, a scrambling procedure may be defined that, for each memory compiler configuration (NW,CM), takes a metal layer parameter as input and returns the corresponding physical layer.

Physical Straps

FIG. 8 shows an example of a rectangular physical strap 800 in a memory array. Statistics show that the awareness of straps used to locate decoders in a memory array can reduce the probability of certain types of defects between certain bitlines and/or wordlines. Both the location of physical strap and its size (here, width) is useful for simplifying a DB pattern. FIG. 8 shows an example strap in a memory array, where w indicates strap width. The table format below locates a rectangular strap through two row address and/or two column addresses. Each column address is defined by a pair of numbers: I/O number and the column number in a corresponding CM.

Power Line Distribution Among Bitlines

In some cases, if a Vdd power line is located between two neighboring bitlines of two adjacent cells in the same row and it is in the same metal layer as cell bitlines, then a spot defect connecting these two neighboring bitlines will be shorted to the Vdd line.

Redundancy Distribution

Figure 9:
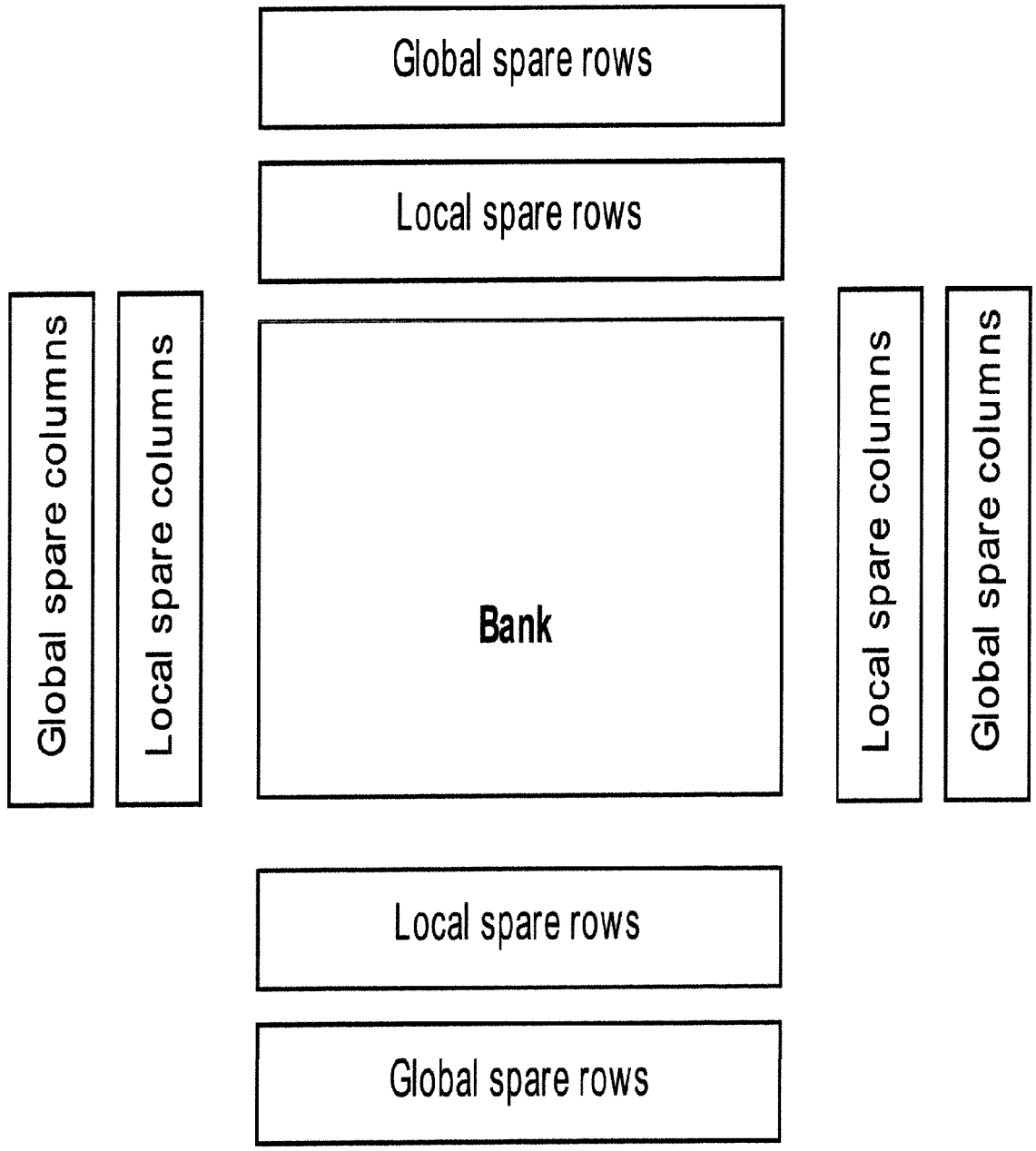
FIG. 9 illustrates a block diagram of an example of redundancy distribution for a memory bank.

FIG. 9 illustrates a block diagram of an example of redundancy distribution 900 for a memory bank. After testing, a repair application can be applied to a memory structure. This is the application in which information on the distribution of the redundancies and their scrambling, may be used. FIG. 9 shows a typical redundancy distribution for a memory bank.

Repair Scrambling

The test engine may be an actual built-in self test (BIST) engine (built into the memory IC chip, or a separate chip). The repair (including for example the blowing of fuses) may be performed by the test engine, after manufacturing of the IC chip, not during the design of the test engine. So the actual repair information, including which columns or rows are to be replaced, may not be generated until after the test engine has been built and allowed to complete the test. The memory in the chip is then reconfigured when the repair process is allowed to be completed.

Repair Scrambling describes the repair mechanism for all redundant elements in the proposed memory array. This information is used by different applications to predict the reconfiguration of memory after repair. It is possible to inject faults into memory behavioral model, run the BIST and built-in redundancy analysis (BIRA). Repair scrambling identifies exactly how a faulty cell is replaced by a redundant element. For example, it may be shift based repair (widely used for column repair) or re-addressing based repair (mainly used in row repair).

Minimum Number & Configuration of Memory Instances for Scramble Information Verification The verification instance generator is configured to produce a set of required verification memory instance configurations based on the received first set of memory structural primitives including a scramble-related description of a structure the memory instance; and the verification instance generator generates a minimum set of memory instances that includes:

Address Scramble:

At least one memory instance of each multiplexer ratio in the memory array (CM) and a number of memory banks in the memory array (BK) configuration with all existing address pins has to be verified in the case where the structural primitives include one or more address scramble features.

For example, in case of "Y0 Y1 Y2 Y3 XA0 XA1 XA2 XC0 XC1 XB0 XB1 XB2 XD0 XD1" for CM=16&BK=1, an instance with CM=16&BK=1 and has to be verified in order to have all X Decoders present. This instance can be the one with 1024 rows==>NW=16K.

Here the maximum number of instances will equal 32 (8 possibilities for BK value and 4 possibilities for CM value).

Bank Scramble:

One memory instance for each BK value has to be verified for the bank scramble information verification. No additional instance is required in this case because such an instance already has been included in the set for address scramble Row Scramble:

In order to verify the Row Scramble information a memory instance that has all X Pins has to be verified, so all Row decoders will be verified. No additional instances are required in this case because such instances already have been included in the set for address scramble.

I/O Cell Scramble:

Any memory instance with more then one I/O Pin has to be verified for the I/O Cell scramble information verification. This option may be selected with any of instances being verified for Address scramble.

Column Scramble:

Memory instances with all possible CM values are verified in case of column scramble. To have the column scramble fully verified, both the odd (if possible) and even NB values have to be considered. It is preferred to have to ensure the XDEC mirroring case verification as well.

Bit-Line and Column Twisting:

In order to verify bit-line and column twist scramble types the physical location of twist rows and the types of twist rows should be verified. Memory instances with different number of rows have to be considered to verify all PR ranges.

For example, having a Twist Location page filled as bellow:

1-16
2-128
4-1024
8-1024
16-1204

The following instances with minimum number of rows are considered:

an instance with PR=16
an instance with PR=17
an instance with PR=128
an instance with PR=129
an instance with PR=1024

The twist row type for each case and then the bit-line and column twist scramble types have to be verified to ensure that all specified ranges are correct.

All possible reminders of row groups should be considered for each number of segments.

The maximum number of instances that may be required will be equal to 32 (2+2+4+8+16=32).

Row Redundancy:

Any single memory instance can be verified in case of row redundancy information verification.

Column Redundancy:

Memory instances with all possible CM values (because the column redundancy may be I/O based) have to be verified in case of column redundancy information verification. Such instances already have been included in the set of configurations for Address scramble.

The total number of instances will not exceed the number 32+32=64.

Description of Minimal Patterns for Scramble Information Verification

Scrambling Types

Scrambling types that can be verified using the minimal number of verification patterns
1. Memory bit-line twisting;
2. Bank scrambling;
3. Column scrambling;
4. Row scrambling;
5. I/O cell scrambling;
6. Column twist;
7. Address scrambling.

Three groups of verification patterns are used for verification of the above listed scrambling types within SIV flow. The detailed description of these patterns is provided in next section.

Strap Scrambling

A software component is configured to verify the strap scrambling. The Strap scrambling software component calculates the coordinates of straps based on the GDS layout and compares them with the corresponding data on strap scrambling obtained by SIG tool.

Additionally, the model of memory repairing using the algorithm of redundancy allocation is used.

Verification of Memory Bit-Line Twisting

The topological column stripe pattern with regard to memory bit-lines is applied for the memory bit-line twisting verification. (see FIG. 3). The vector output generator and memory programming tool are used to program the memory array cells to obtain a topological column stripe with regard to the bit-lines in the memory array. Since the topological column stripe pattern does not define the contents of cells in the memory array but defines the values on bit-lines uniquely, by applying LVS and SPICE simulation the software tool allows to find the bit-line twist rows in the memory array. Moving along a column in the memory array and applying Read operation toward two neighboring cells in the same column, different values of 01 or 10 are obtained that is the evidence the bit-lines are twisted or there is a twist row between 2 rows corresponding to 2 adjacent cells.

Verification of Bank Scrambling

Physical verification pattern with different values on different physical banks has to be applied to verify bank scrambling. The pattern with different values on different rows can be used for bank verification for memories with equal number of rows and columns.

In case if the number of rows is lower than the number of columns the rectangular memory can be split into a square of (#PR)×(#PR) size and a rectangular of (#PR)×((#PC)−(#PR)) size.

Verification of Column Scrambling

The "don't care" bits in the verification pattern can be configured in order to use the pattern for verification of column scrambling as well. The memory array can be split into a k number of squares of (#PR)×(#PR) size and a rectangular of (#PR)×((#PC)−k(#PR)) size with (#PR)>(#PC)−k(#PR).

In general, when #PC>#PR, $\lceil \log_{\#PR} \#PC \rceil$ patterns have to be used. In case of #PR>#PC, $\lceil \log_{\#PC} \#PR \rceil$ patterns are used. Thus, in general, the number of verification patterns of the considered type is equal to max ($\lceil \log_{\#PR} \#PC \rceil$, $\lceil \log_{\#PC} \#PR \rceil$).

Verification of Row Scrambling

A physical verification pattern that will have different values on each row (in local bank) has to be applied to verify row scramble type. It is easy to check that the same verification pattern used for verification of bank scrambling and column scrambling can also be used for row scrambling verification.

Verification of I/O Cell Scrambling

A physical pattern having different values on different I/O slices has to be applied to verify I/O cell scrambling. It is easy to check that the same verification pattern used for verification of bank scrambling, column scrambling and row scrambling can also be used for I/O cell scrambling verification.

Verification of Column Twisting

SIG tool supports the following 4 types of column twisting.

Each column is twisted with the one that makes the distance between the columns equal to 2.

One column from the whole I/O slice is twisted with the next one that belongs to another I/O slice.

Two columns from the whole I/O slice are twisted with the next 2 ones that belong to another I/O slice and the distance equals to 2.

A physical pattern to detect any error of column twisting with distance of one and two has to be applied to verify the column twisting.

Verification of Redundancy and Dummy Element Distribution

The verification pattern to verify redundancy and dummy element distribution assumes all memory cells are of "0" value except for redundancy and dummy element fields that are "1"s.

Verification of Address Scrambling

Having verified all these scramble types, we will have address scrambling verified as it is the superposition of these types.

Total Number of Verification Patterns

The total number of verification patterns used for verification of the listed above 8 scrambling types depends on the memory compiler and the certain configuration of compiler main parameters.

Figure 10:
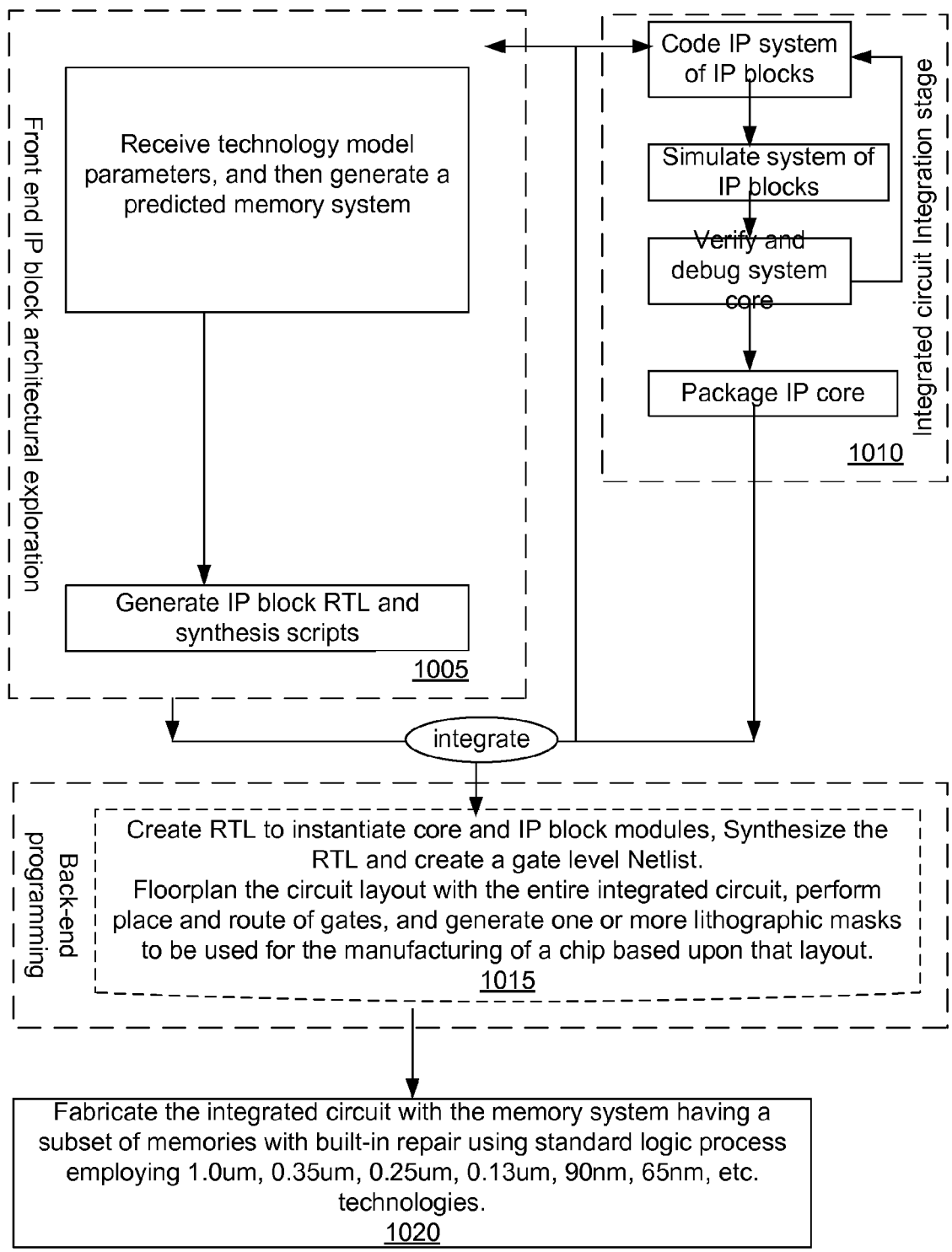
FIG. 10 illustrates a flow diagram of an example process for generating an IC device having a built-in test engine.

FIG. 10 illustrates a flow diagram of an example process for generating a device, such as a System on a Chip, with a built-in test engine created as described above. The example process may utilize an electronic circuit design generator, such as a memory compiler, that is part of an Electronic Design Automation (EDA) toolset. This process will also use the structural primitive verification tool. The information representing the apparatuses and/or methods described above may be contained in an instance of a cell library, soft instructions in an electronic circuit design generator such as a compiler, or similar machine-readable storage medium storing this information. The information representing the apparatuses and/or methods stored on the machine-readable storage medium may then be used in the process of creating the apparatuses and/or methods described above.

In an embodiment, an example electronic circuit design generator may comprise the following: a graphic user interface; a common set of processing elements; and a library of files containing design elements such as circuits, control logic, and cell arrays. Traditionally, there exist two major stages of SOC design: front-end processing and back-end programming. Front-end processing comprises the design and architecture stages, which includes design of the SOC schematic. The front-end processing may include connecting models, configuration of the design, simulating and tuning during the architectural exploration. The design is typically simulated and tested. Front-end processing traditionally includes simulation of the circuits within the SOC and verification that they should work correctly. The integration of the electronic circuit design may include packing the cores, verifying the cores, simulation and debugging. The tested and verified components then may be stored as part of a library.

Back-end programming traditionally includes programming of the physical layout of the SOC such as placing and routing, or floor planning, of the circuit elements on the chip layout, as well as the routing of all interconnects between components. Thus, the floor plan may be generated imported and edited. Back-end programming further includes the physical verification of the layout to verify that it is physically manufacturable and the resulting SOC will not have any function-preventing physical defects. While front-end views support documentation, simulation, debugging, and testing, the back-end files, such as a layout, physical Library Exchange Format (LEF), etc are for layout and fabrication.

The electronic circuit design generator may include object code in a set of executable software programs. The library of files containing design elements may be a stand alone program by itself. The electronic circuit generator provides timing diagrams, power and area aspects of each component, models coded to represent the components in order to run actual operation and configuration simulations. The electronic circuit design generator may generate a netlist and a layout targeted to fit in the space available on a target chip. Typically, the electronic circuit design generator will store the data representing the memory test engine on a machine-readable storage medium. The electronic circuit design generator then may provide the device layout (including that of the test engine) to be used to generate one or more lithographic masks utilized in the fabrication of the device including the test engine. The electronic circuit design generator may also provide a netlist for verification of the device and the test engine.

In block 1010, the electronic circuit design generator may provide designs to simulate and verify the operation of the circuits. The machine may also generate simulations of representations of the circuits described above that can be functionally tested, timing tested, debugged and validated.

In block 1015, the generated device layout may be integrated with the rest of the layout for the chip. Also, the machine may generate representations of the circuits described above for simulations, one or more lithographic masks for transferring the circuit design onto the chip during manufacture, or other similar useful derivations of the circuits described above.

In block 1020, a fabrication facility may fabricate one or more chips utilizing the lithographic masks generated from the electronic circuit design generator's circuit design and layout. Fabrication facilities may use a standard CMOS logic process having minimum line widths such as 1.0 um, 0.50 um, 0.35 um, 0.25 um, 0.18 um, 0.13 um, 0.10 um, 90 nm, 65 nm or less, to fabricate the chips. The size of the CMOS logic process employed typically defines the smallest minimum lithographic dimension that can be fabricated on the chip using the lithographic masks, which in turn, determines minimum component size. In one embodiment, the electronic circuit design generator is designed for embedded applications in a standard CMOS logic process.

In one embodiment, an electronic circuit design generator may be implemented in software as a set of data and instructions, such as a software cell library callable to other programs, or as an executable program with the software cell library in one program, stored on a machine-readable medium. A machine-readable storage medium may include any mechanism that provides (e.g., stores and/or transmits) information in a form readable by a machine (e.g., a computer). For example, a machine-readable medium may include, but is not limited to: read only memory (ROM); random access memory (RAM); magnetic disk storage media; optical storage media; flash memory devices; DVD's; electrical, optical, acoustical or other forms of propagated signals (e.g., carrier waves, infrared signals, digital signals); EPROMs; EEPROMs; FLASH, magnetic or optical cards; or any other type of media suitable for storing electronic instructions.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

While some specific embodiments of the invention have been shown the invention is not to be limited to these embodiments. For example, most functions performed by electronic hardware components may be duplicated by software emulation. Thus, a software program written to accomplish those same functions may emulate the functionality of the hardware components in input-output circuitry. The invention is to be understood as not limited by the specific embodiments described herein, but only by scope of the appended claims.

What is claimed is:

1. A structural primitive verification tool for memory compilers, comprising a non-transitory machine-readable medium having stored therein instructions that, when executed by a processor, cause the processor to:

receive a first set of memory structural primitives;

compare a first data vector output to second data vector output, the first data vector output generated from a first model of a memory instance derived from the first set of memory structural primitives, the second data vector output generated from a second model of a memory instance derived from a memory layout file of a memory compiler to verify an integrity of the first set of memory structural primitives;

test each of a plurality of memory instances to create a verified structural model for each of the memory instances in the memory compiler;

produce a set of data verification patterns for each memory instance;

program a memory instance layout file for each data verification pattern; and generate a programmed instance layout file of the memory instance, wherein the data verification pattern is programmed into the memory instance layout file for each verification pattern.

2. The structural primitive verification tool of claim 1, further comprising instructions to:

generate memory instances based on a memory instance graphic design system (GDS) file generated by the memory compiler using the data verification pattern; and map test data patterns for verification from a logical address in a layout of a memory instance to a physical layout of the memory instance.

3. The structural primitive verification tool of claim 2, wherein the first set of memory structural primitives include other structural primitives and are verified using the data verification pattern, the other structural primitives describing scrambling properties of one or more of Memory bit-line twisting; Bank scrambling; Column scrambling; Row scrambling; input output (I/O) cell scrambling; and Address scrambling.

4. The structural primitive verification tool of claim 1, further comprising instructions to:
produce a set of verification memory instance configurations based on the received memory structural primitives including a scramble-related description of a structure the memory instance; and
generate a memory instance layout file for a memory configuration in a graphic design system (GDS) file format.

5. The structural primitive verification tool of claim 4, further comprising instructions to generate a number of memory instances based on different structural primitive scrambling criteria including address scramble, bank scramble, row scramble, I/O cell scramble, column scramble, bit-line and column twisting, row redundancy, and column redundancy.

6. The structural primitive verification tool of claim 1, further comprising instructions to invoke a layout verses schematic tool to use the memory instance with the data verification pattern to extract a memory net-list from an instance of a layout file of the memory instance.

7. The structural primitive verification tool of claim 6, wherein a simulation tool uses the memory net-list to run a read cycle simulation for addresses of the second model of the memory instance and generate a data vector output.

8. The structural primitive verification tool of claim 1, further comprising instructions to:
predict a data vector output for each verification pattern based on the first set of memory structural primitives;
provide a physical layout to logical layout translation for the memory instance; and
feed a data verification pattern into the first model of the memory instance.

9. The structural primitive verification tool of claim 1, wherein the first data vector output corresponds to a physical data pattern of logical ones, logical zeros and any combination of the ones and zeros according to a logical-to-physical address mapping of the memory instance.

10. The structural primitive verification tool of claim 1, further comprising instructions to:
produce a set of verification memory instance configurations based on the received first set of memory structural primitives including a scramble-related description of a structure the memory instance; and
generate a minimum set of memory instances that includes (i) at least one memory instance for each minimum and maximum value of multiplexer ratio in a memory array and a number of memory banks in the memory array configuration has to be verified in the case where the structural primitives include one or more address scramble features; (ii) one single memory instance for each minimum and maximum value of number of memory banks in the memory array value has to be verified in the case where the structural primitives include one or more bank scramble features; and (iii) memory instances for each minimum and maximum value of column multiplexer ratio in the memory array values has to be verified in the case where the structural primitives include one or more column scramble features.

11. The structural primitive verification tool of claim 1, further comprising instructions to:
verify strap scrambling by calculating coordinates of straps based on a Graphic Design System (GDS) layout file; and
compare the calculated coordinates with the corresponding data on received strap scrambling.

12. A fabricated integrated circuit containing one or more memory arrays having one or more memory instance verified by a structural primitive verification tool comprising a non-transitory machine-readable medium having stored therein instructions that, when executed by a processor, cause the processor to:
receive a first set of memory structural primitives;
compare a first data vector output to second data vector output, the first data vector output generated from a first model of a memory instance derived from the first set of memory structural primitives, the second data vector output generated from a second model of a memory instance derived from a memory layout file of a memory compiler to verify an integrity of the first set of memory structural primitives;
test each of a plurality of memory instances to create a verified structural model for each of the memory instances in the memory compiler produce a set of data verification patterns for each memory instance;
program a memory instance layout file for each data verification pattern; and
generate a programmed instance layout file of the memory instance, wherein the data verification pattern is programmed into the memory instance layout file for each verification pattern.

13. A computing machine-implemented method for testing a memory array in a design of an integrated circuit, comprising:
receiving a first set of structural primitives;
at a computing device, comparing a first data vector output and a second data vector output, the first data output generated from a first model of a memory instance derived from the first set of memory structural primitives, the second data vector output generated from a second model of a memory instance derived from a memory layout file to verify to an integrity of the first set of memory structural primitives;
testing each of a plurality of memory instances to create a verified structural model for each of the memory instances produce a set of data verification patterns for each memory instance;
program a memory instance layout file for each data verification pattern; and
generate a programmed instance layout file of the memory instance, wherein the data verification pattern is programmed into the memory instance layout file for each verification pattern.

14. The method of claim 13, further comprising:
generating memory instances for the second model based on the memory instance layout file;
programming the generated memory instances with a data verification pattern; and
mapping test data patterns for verification from a logical address in the layout of a memory instance to a physical layout of the memory instance.

15. The method of claim 14, further comprising generating a number of instances based on different structural primitive scrambling criteria including address scramble, bank scramble, row scramble, I/O cell scramble, column scramble, bit-line and column twisting, row redundancy, and column redundancy.

16. The method of claim 13, further comprising:
producing a set of verification memory instance configurations based on the received first set of memory structural primitives including a scramble-related description of a structure the memory instance; and generating a minimum set of memory instances that includes (i) at least one memory instance for each minimum and maximum value of multiplexer ratio in a memory array and a number of memory banks in the memory array configuration has to be verified in the case where the structural primitives include one or more address scramble features; (ii) one single memory instance for each minimum and maximum value of number of memory banks in the memory array value has to be verified in the case where the structural primitives include one or more bank scramble features; and (iii) memory instances for each minimum and maximum value of column multiplexer ratio in the memory array values has to be verified in the case where the structural primitives include one or more column scramble features.

17. A fabricated integrated circuit containing one or more memory arrays having one or more memory instance verified by a method comprising:

receiving a first set of memory structural primitives;

at a computing device, comparing a first model of a memory instance derived from the first set of memory structural primitives to a second model of a memory instance derived from a memory layout file of a memory compiler to verify an integrity of the first set of memory structural primitives;

testing each of a plurality of memory instances to create a verified structural model for each of the memory instances in the memory compiler produce a set of data verification patterns for each memory instance;

program a memory instance layout file for each data verification pattern; and generate a programmed instance layout file of the memory instance, wherein the data verification pattern is programmed into the memory instance layout file for each verification pattern.

* * * * *